US010387926B2

(12) United States Patent
Li et al.

(10) Patent No.: US 10,387,926 B2
(45) Date of Patent: Aug. 20, 2019

(54) CLOUD-BASED METHODS FOR IDENTIFYING ENERGY PROFILE AND ESTIMATING ENERGY CONSUMPTION AND CLOUD-BASED ENERGY PROFILE USAGE IDENTIFICATION SYSTEM

(71) Applicant: Global Design Corporation Ltd., Wanchai (HK)

(72) Inventors: Yee Shing Li, Hong Kong (HK); Yung Fai Ho, Hong Kong (HK)

(73) Assignee: GLOBAL DESIGN CORPORATION LTD., Wanchai (HK)

( * ) Notice: Subject to any disclaimer, the term of this patent is extended or adjusted under 35 U.S.C. 154(b) by 929 days.

(21) Appl. No.: 14/928,894

(22) Filed: Oct. 30, 2015

(65) Prior Publication Data

US 2017/0124609 A1 May 4, 2017

(51) Int. Cl.
*G06Q 30/04* (2012.01)
*G01R 21/133* (2006.01)
(Continued)

(52) U.S. Cl.
CPC ........... *G06Q 30/04* (2013.01); *G01R 21/133* (2013.01); *H04L 67/306* (2013.01); *G06Q 50/06* (2013.01)

(58) Field of Classification Search
CPC ...... G06Q 30/04; G06Q 50/06; G01R 21/133; H04L 67/306
(Continued)

(56) References Cited

U.S. PATENT DOCUMENTS

| 2006/0111796 A1* | 5/2006 | Van Heteren | .......... G01D 4/004 700/20 |
| 2007/0203860 A1* | 8/2007 | Golden | .................. G06Q 10/04 705/412 |

(Continued)

FOREIGN PATENT DOCUMENTS

| CN | 102246378 A | 11/2011 |
| CN | 103999114 A | 8/2014 |
| CN | 104620273 A | 5/2015 |

OTHER PUBLICATIONS

"Calculate a Bill"; SMECO; accessed via webarchive from Sep. 7, 2015; available at: https://web.archive.org/web/20150907161111/https://www.smeco.coop/account/residential-bill-calculator (Year: 2015).*

*Primary Examiner* — Kevin H Flynn
*Assistant Examiner* — Emmett K. Walsh
(74) *Attorney, Agent, or Firm* — Slater Matsil, LLP

(57) ABSTRACT

A cloud-based method for identifying a energy profile of an end user is provided. The method includes obtaining information including a total amount of consumed energy and a total equivalent for at least one previous period from at least one listing of the end user, and estimating a consumption profile for a plurality of time slots based on the total amount of consumed energy. The method further includes obtaining a plurality of rate schedules provided over a data network, each schedule corresponding to a energy profile provided by a utility provider, calculating an estimated equivalent for each energy profile based on the estimated consumption profile and schedule corresponding to each energy profile, calculating an error between obtained total equivalent for the period and each one of the calculated estimated equivalent for each energy profile, and selecting a energy profile from the plurality of energy profiles corresponding to the smallest calculated error as the energy profile most likely used by the (Continued)

end user. A cloud-based method for estimating energy consumption charges of an end user and a cloud-based energy profile identification system are also disclosed.

14 Claims, 7 Drawing Sheets

(51) Int. Cl.
*H04L 29/08* (2006.01)
*G06Q 50/06* (2012.01)

(58) Field of Classification Search
USPC .................................................. 705/412, 421
See application file for complete search history.

(56) References Cited

U.S. PATENT DOCUMENTS

| | | | |
|---|---|---|---|
| 2009/0309756 A1* | 12/2009 | Mason, Jr. | G01D 4/004 340/870.02 |
| 2011/0313588 A1 | 12/2011 | Jensen et al. | |
| 2012/0290862 A1 | 11/2012 | Brown et al. | |
| 2013/0274928 A1* | 10/2013 | Matsuoka | G05D 23/1904 700/276 |
| 2014/0163757 A1 | 6/2014 | Murayama et al. | |
| 2014/0277808 A1* | 9/2014 | Irisarri | G05B 15/02 700/295 |
| 2015/0057820 A1* | 2/2015 | Kefayati | G06Q 50/06 700/291 |
| 2015/0253795 A1 | 9/2015 | Saito et al. | |
| 2016/0063626 A1* | 3/2016 | Axelrod | G06Q 40/04 705/37 |
| 2016/0371363 A1* | 12/2016 | Muro | G01D 9/28 |

* cited by examiner

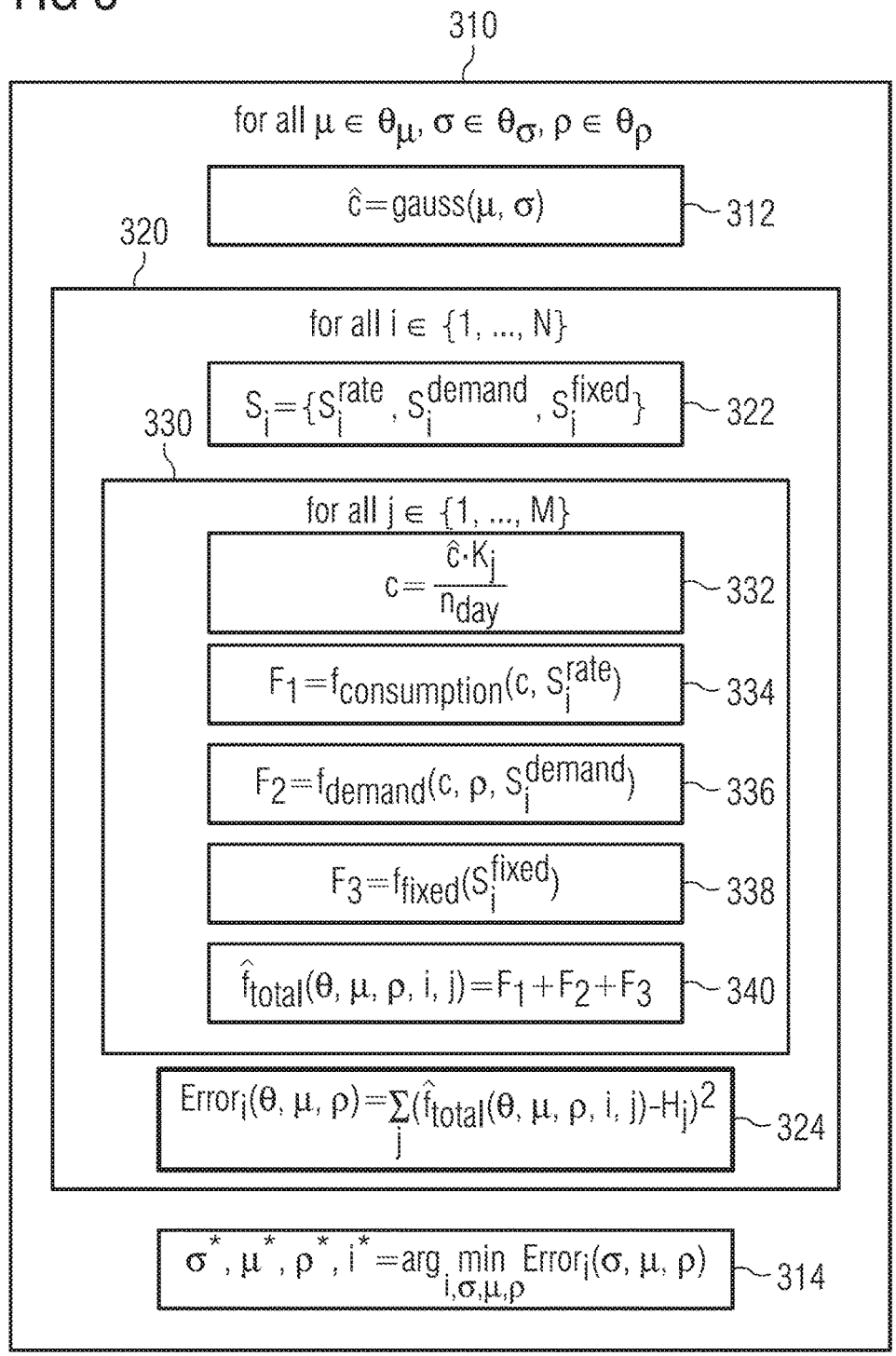

FIG 4A

```
View rate - U.S. Utility Rate Dat...                                          — □ ×
←                                          C □ Google              ⌕ ☆ □ ⇩ ⇧ ≡
□ Meistbesucht □ LEO Deutsch-Englisch □ Google W Wikipedia(de) W Wikipedia(en) □ Aktensuchte □ Währungsrechner-Ya.. □ EHF Webmail □ Google Maps
```

OpenEI  Wiki  Apps  Datasets  Community
Home

View Rate

| Basic Information | Demand | Energy | Fixed Charges |

[Next]

Basic Information
- Utility Name: Jersey Central Power & Lt Co (New Jersey)
- ? EIA Id: 9726
- ? Rate Name: General Service off-Peak Water Heating Service
- ? Expert Has Verified: Yes
- ? Effective Date: 06/01/2014
- ? End Date:
- ? Supersedes:
- Sector: Commercial
- ? Description: Rate is for off-peak water heater usage only. Usage at this rate not allowed during on-peak hours. Service Classification GS is available for general service purposes at secondary voltages not included under Service Classifications RS, RT, RGT or GST.
- ? Source or Reference: https://www.firstenergycorp.com/content/dam/customer/Customer%20Choice/Files/New%20Jersey/tariffs/BPU%2010%20Part%20III%20-%20effective%206-1-14.pdf
- ? Source Parent: https://www.firstenergycorp.com/content/customer/customer_choice/new_jersey/new_jersey_tariffs.html
- ? Assume net metering (buy=sell):

Basic Comments

Applicability

Demand
- Minimum (kW)
- Maximum (kW)
- History (months)

Energy
- Minimum (kWh)
- Maximum (kWh)
- History (months)

Service Voltage
- Minimum (V)
- Maximum (V)

Character of Service
- Voltage Catgegory: Secondary
- Phase Wiring: Single Phase

Revision History
- 05/19/2014 13:14:44  Kmlavoi
- 05/19/2014 13:25:28  Kmlavoi
- 05/19/2014 13:36:07  Kmlavoi
- 05/19/2014 14:03:01  Kmlavoi
- 05/29/2014 15:31:25  Uloyd
- 05/30/2014 07:09:38  Uloyd
- 05/30/2014 07:15:37  Uloyd
- 05/30/2014 07:45:59  Uloyd
- 05/30/2014 07:59:01  Uloyd
- 05/30/2014 07:59:21  Uloyd
- 06/02/2014 07:40:20  Csphih
- 03/26/2015 15:26:30  layhuggins
- 05/28/2015 02:16:25  Mpkulka (Approval)

[Next]

[Report an Error]

FIG 4C

OpenEI  Wiki  Apps  Datasets  Community
Home

View Rate

| Basic Information | Demand | Energy | Fixed Charges |

[Back] [Next]

Tiered Energy Usage Charge Structure

| Period | Tier | Max kW Usage ? | Max Usage Units ? | Rate $/kW ? | Adjustments $/kW ? | Sell $/kW ? |
|---|---|---|---|---|---|---|
| 1 | 1 | | kWh | 0.021922 | 0.108765 | |
| 2 | 1 | | kWh | 0.021922 | 0.100932 | |
| 3 | 1 | | kWh | 0 | | |

Weekday Schedule

Weekend Schedule

Other Energy Attributes

Energy Comments
Rate is for off-peak water heater usage only. Usage at this rate not allowed during on-peak hours.
Adjustement = BGS-FP + NGC + SCC + RCC + SBC

[Back] [Next]

[Report an Error]

CLOUD-BASED METHODS FOR IDENTIFYING ENERGY PROFILE AND ESTIMATING ENERGY CONSUMPTION AND CLOUD-BASED ENERGY PROFILE USAGE IDENTIFICATION SYSTEM

TECHNICAL FIELD

The present invention relates to energy profile usage identification, and in particular to cloud-based methods for identifying energy profile and estimating energy consumption and cloud-based energy profile usage identification system.

BACKGROUND

According to the 2010 to 2011 Annual Directory and Statistical Report of the American Public Power Association, in the US, there is a total of 3,269 different electricity utility providers. Each utility provider has its own pricing strategy, and each customer may have a different schedule structure based on the type of application or building being supplied with electricity. For an end user, it is therefore increasingly difficult to deduce the amount of money that has to be paid for a particular period, such as a month, before they receive the respective electricity bill.

One way of estimating an amount to be paid at the end of a period is to assume that the billed amount remains more or less the same for each period. However, such an assumption is often incorrect, as the amount of energy used varies based on different external factors, such as holiday periods or weather conditions. Another approach in estimating the amount to be paid is to monitor the current energy consumption, for example using a so-called smart metering device, and then estimate the billing amount based on the energy consumption. However, this approach relies on detailed information about the energy profile used for billing the customer. Often, such energy profile information is only available in textual form in the end user's contract. However, extracting this information in order to convert an amount of energy used into an amount to be paid in terms of money for the used electricity is very user unfriendly and unreliable.

Accordingly, there is a need for better methods and systems for identifying a energy profile of an end user and estimating energy consumption charges of an end user.

SUMMARY

According to a first aspect of the present invention, a cloud-based method for identifying an energy profile of an end user is disclosed. The method comprises obtaining information including a total amount of consumed energy and a total equivalent for at least one previous period from at least one listing of the end user, and estimating a consumption profile for a plurality of time slots based on the total amount of consumed energy. The method further includes obtaining a plurality of rate schedules provided over a data network. Each schedule corresponds to an energy profile provided by a utility provider. The method further includes calculating, for each energy profile, an estimated equivalent by calculating at least a first contribution based on the estimated consumption profile and the schedule corresponding to the respective energy profile, and calculating, for each energy profile, an error between the obtained total equivalent for the period and each one of the respective calculated estimated costs comprising at least the first contribution and the second contribution. An energy profile is selected from the plurality of energy profiles corresponding to the smallest calculated error as the energy profile most likely used by the end user.

According to the second aspect of the present invention, a cloud-based method for estimating energy consumption charges of an end user is disclosed. The cloud-based method comprises obtaining information including a total amount of consumed energy and a total equivalent for at least one previous period from at least one listing of the end user, and identifying an energy profile of the end user corresponding to the schedule of a plurality of rate schedules based on a comparison of the obtained total equivalent and calculated energy profile equivalent calculated based on each one of the plurality of rate schedules. The method also includes calculating current energy equivalent based on the schedule corresponding to the identified energy energy profile and a current energy consumption of the end user.

According to a third aspect of the present invention, a cloud-based energy profile identification system is disclosed. The system comprises a processor including a non-transitory computer-readable medium storing program modules executable by the computer. The modules comprise a billing data module configured to obtain information including a total amount of consumed energy and a total equivalent for a period from at least one listing of an end user, a consumption profile estimation module configured to estimate a consumption profile for a plurality of time slots based on the total amount of consumed energy, and a peak load estimation module configured to estimate a peak load for a given period based on the estimated consumption profile. The modules further comprises a energy profile data module configured to obtain a plurality of rate schedules provided over a data network, each schedule corresponding to a energy profile provided by a utility provider, a usage equivalent calculation module configured to calculate, for each energy profile, a calculated equivalent by calculating a first contribution based on the estimated consumption profile and the schedule corresponding to the energy profile, and a second contribution based on the estimated peak load and the schedule corresponding to the energy profile. The cloud-based energy profile identification system further comprises an error calculation module configured to calculate, for each energy profile, an error between the obtained total equivalent for the period and the calculated estimated equivalent comprising the first contribution and the second contribution, and a energy profile output module configured to output parameters corresponding to a schedule of a energy profile from the plurality of energy profiles corresponding to the smallest calculated error.

According to different aspects of the present invention, a cloud-based server extracts information readily available from a user's electricity bill, in particular a total amount of consumed energy and a total equivalent for the period from a user's bill. Based on this information, the cloud-based system performs a reverse calculation in order to match the user's bill to one of a plurality of different energy profiles, each energy profile being represented by a schedule. Once the correct energy profile is identified, this information may be used to calculate a current energy equivalent based on the identified schedule and a current energy consumption of the end user.

BRIEF DESCRIPTION OF THE DRAWINGS

Various embodiments of the present invention will be described below with reference to the attached drawings. In the drawings, like reference symbols are used for like elements of different embodiments.

FIG. 3 illustrates a flowchart of a method for identifying a energy profile of an end user.

FIGS. 4A to 4D illustrate a schedule for an electricity energy profile available from a third party website.

DETAILED DESCRIPTION OF ILLUSTRATIVE EMBODIMENTS

Embodiments of the present invention relate to the identification of an energy profile energy usage profile of an end user and the estimation of energy consumed based on an identified energy profile energy usage profile. In various embodiments, the present invention relates to a cloud-based method for identifying a energy profile energy usage profile of an end user, a cloud-based method for estimating energy consumption of an end user and a cloud-based energy profile energy usage profile identification system.

Figure 1:
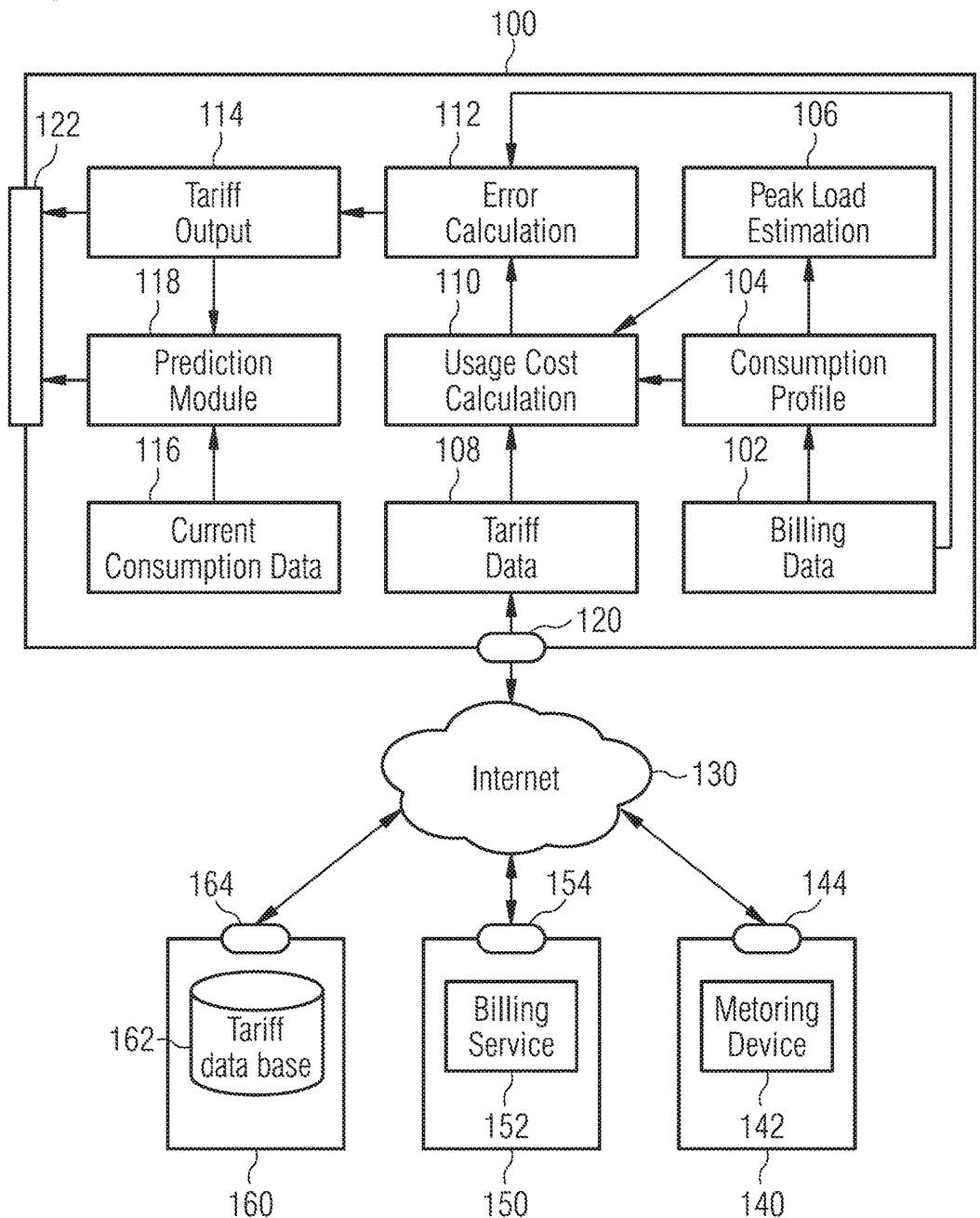
FIG. 1 illustrates a schematic diagram of a cloud-based energy profile identification system in accordance with an embodiment of the invention.

FIG. 1 shows a cloud-based energy profile identification system 100 in accordance with an embodiment of the present invention. The energy profile may be a tariff. The cloud-based energy profile identification system 100 comprises a billing data module 102, a consumption profile estimation module 104 and a peak load estimation module 106. Moreover, the system 100 comprises an energy profile data module 108, a usage equivalent calculation module 110 and an error calculation module 112. The usage equivalent may be a usage cost. Furthermore, the system 100 comprises an energy profile output module 114, a current consumption data module 116 and a prediction module 118. These modules may be implemented in hardware or software or a combination thereof. For example, the individual modules may take the form of computer code stored on a non-transitory storage device for execution by a general purpose processing device, such as a processor of a web-server computer.

The data used or produced by the various modules of the system 100 may be stored in an internal or external database (not shown). Data may be received by the system 100 through a web service interface 120 provided via a gateway to a data network, such as the Internet 130. Moreover, the data collected by the energy profile identification system 100 may also be displayed or modified by use of a user interface 122. For example, a web-based user interface may be provided for authorized users of the energy profile identification system 100.

In operation, the energy profile information system 100 obtains various pieces of information from external sources. In particular, in the described embodiment, a metering device 142 installed at a user site 140 may provide an end user's current energy consumption through a gateway 144, the Internet 130 and the web service interface 120 to the current consumption data module 116. Moreover, an administrator of the user site 140 or a billing service 152 of a utility provider 150 may provide electronic information to the billing data module 102. The information may be billing information. Such billing data may be provided by means of a gateway 154 of the utility provider 150 directly or may be provided from the utility provider 150 to the user site 140 and then forwarded from the user site 140 over the Internet 130 to the billing data module 102.

Lastly, in the embodiment shown in FIG. 1, a third party provider 160 maintains a database 162 with energy profile information. In particular, in the database 162 a plurality of rate schedules for various utility energy profiles of a plurality of utility providers 150 is stored. Such information may be entered manually by employers of the third party platform 160, may be provided by volunteers as part of a crowd sourcing project, or may be provided automatically by means of a corresponding interface from each utility provider 150. The database 162 is available over a gateway 164 such that the energy profile data stored in the database 162 can be queried by the energy profile data module 108 of the energy profile identification system 100.

The energy profile identification system 100 can be used to automatically identify a energy profile used by an end user of the user site 140. Alternatively or in addition, the energy profile identification system 100 may also be used to predict current or future energy costs of the user site 140 based on an identified energy profile of the corresponding end user.

Figure 2:
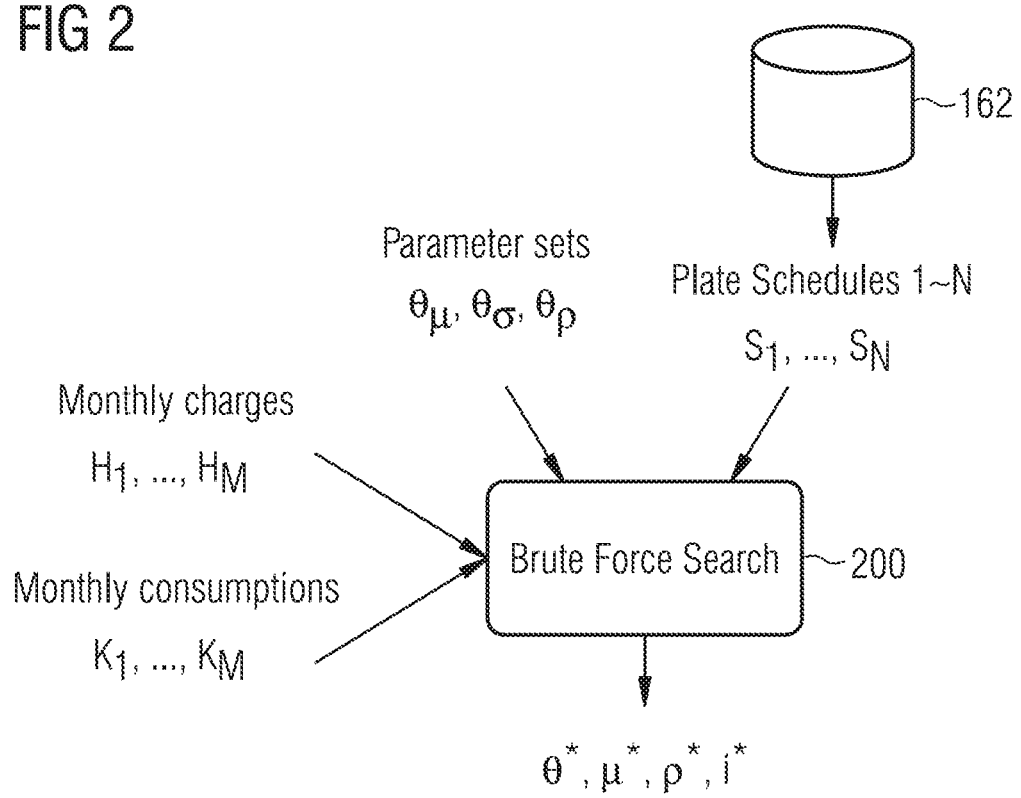
FIG. 2 illustrates a schematic diagram of the data considered by a energy profile identification algorithm.

In the following, the data model employed by the energy profile identification system 100 is detailed with respect to FIG. 2. As can be seen, the energy profile identification is based on the provision of a total monetary equivalent for a number of period, for example a monthly charge $H_1$ to $H_M$ in US\$ of an end user for a given month. The period may be a billing period. Moreover, corresponding consumption values, e.g. a monthly consumption value $K_1$ to $K_M$ in units of kilowatt hours (kWh) is provided. This information can be provided directly by the utility provider 150, e.g. by an electronic bill, a platform for electricity customers for gaining access to their own detailed electricity data, such as the Green Button website of the NREL, or can be provided by an individual user, e.g. by scanning a paper bill and uploading the scanned bill or by manually entering corresponding data via the user interface 122. Alternatively, such data may also be provided automatically over the web service interface 120 from the metering device 142. From a different data source, for example the database 162 of the third party platform 160, various rate schedules $S_1$ to $S_N$ are provided.

Based on the known charge $H_j$ and monthly consumption $K_j$ of month j as well as the set of rate schedules $S_i$, a reverse energy profile identification can be performed by the system 100 in order to identify a energy profile most likely to be used by an end user. Such an identification can be performed, for example, by a brute-force search 200 considering each possible energy profile schedule $S_i$. The schedule $S_i$ may be a rate schedule.

In the described embodiment, additional parameter sets $\theta_\mu$, $\theta_\sigma$ and $\theta_\rho$ are provided to control the brute force search 200. Such parameter sets may comprise optimization parameters used for estimating a consumption profile based on the given monthly consumption $K_j$. In the embodiment shown in FIG. 2, each parameter set comprises three parameters $\mu$, $\sigma$ and $\rho$.

Based on the brute force search 200, a set of parameters $\mu^*$, $\sigma^*$, $\rho^*$ as well as an index $i^*$ of a schedule $S_i$ are identified, which best match the given set of monthly charges $H_1$ to $H_M$ and monthly consumption values $K_1$ to $K_M$.

FIG. 3 shows in more detail how the brute force search 200 can be implemented by a number of nested iterations. In the described approach, the brute force search 200 comprises three iterations 310, 320 and 330 for each optimization parameter $\mu$, $\sigma$ and $\rho$ of the set of optimization parameters $\theta_\mu$, $\theta_\sigma$ and $\theta_\rho$, for each provided schedule $S_i$, and for each set of information $H_j$ and $K_j$ of available training data.

In the outermost iteration 310, one or several optimization parameter sets $\theta_\mu$, $\theta_\sigma$ and $\theta_\rho$ may be provided, for example based on a statistical analysis of typical user sites, to allow a simple yet efficient modelling of corresponding, standardized consumption patterns of a user site 140. According to the described embodiment, each parameter set comprises three parameters, $\mu$, $\sigma$ and $\rho$, which are used to generate an hourly profile for a daily consumption pattern as well as a maximum peak load of the user site 140 based on the monthly consumption $K_j$ alone. In particular, in a step 312, the parameters $\mu$ and $\sigma$ are used to define a Gaussian or normal distribution with mean value $\mu$ and variance $\sigma$. Based on a set of optimization parameters $\mu$ and $\sigma$, a vector $\hat{c}$ representing a relative hourly consumption pattern can be computed that follows a Gaussian distribution.

Based on this preparation, a consumption profile c can be computed from the monthly consumption $K_j$. For example, the total monthly consumption can be divided by the number of days in the period and then distributed over the hours of day based on the normal distribution defined by the parameters $\mu$ and $\sigma$ as detailed below with respect to step 332.

In order to correct the normal distribution for outliers, a peak load is estimated based on the additional optimization parameter $\rho$ based on the maximum consumption of the energy profile multiplied with a factor of $1+\rho$ as detailed later.

By means of the next iteration 320, each schedule $S_i$ from a plurality of rate schedules $S_1$ to $S_N$ corresponding to a given set of utility energy profiles is selected in a step 322. For example, all rate schedules contained in the database 162 may be selected, or only a subset thereof, such as utility providers operating in a certain area. As shown in FIG. 3, each schedule comprises a number of different parameters, defining different components of the energy profile. In the described example, a rate-based component $S^{rate}$, a demand-based component $S^{demand}$ and a fixed component $S^{fix}$ are provided. These components typically describe piecewise linear functions as detailed in the example below.

In the innermost iteration 330, an estimated equivalent is calculated for each set of optimization parameters $\theta_\mu$, $\theta_\sigma$ and $\theta_\rho$, each available schedule $S_i$ and each period j for which historic billing data $K_j$ and $H_j$ is available.

In the described example, in a first step 332, based on the normal distribution defined by the parameters $\mu$ and $\sigma$, a daily average consumption profile is computed by multiplying the vector c with the monthly consumption $K_j$ and dividing it through the number of days of the particular month.

Based on the consumption pattern c and the calculated peak load, corresponding energy profile costs can be computed for each schedule $S_i$ from a set of known rate schedules. Attention is drawn to the fact that some energy profiles may not necessarily comprise all energy profile components considered. For example, some electricity energy profiles comprise consumption charges, but no demand charges and/or fixed fees.

In the described embodiment, in a step 334, a first contribution $F_1$ is calculated based on the estimated daily consumption profile and the corresponding rate-based equivalent information $S^{rate}$ of the schedule $S_i$. In a step 336, a second contribution $F_2$ is calculated based on the estimated daily consumption profile c, the optimization parameter $\rho$ and the corresponding demand-based equivalent information $S^{demand}$ of the schedule $S_i$. In a step 338, a third contribution $F_3$ is calculated based on the corresponding fixed equivalent information $S^{fixed}$ of the schedule $S_i$. Accordingly, in a step 340, an estimated total amount to be paid $\hat{f}_{total}$ for a given monthly consumption and a selected energy profile can be computed as the sum of these three components $F_1$, $F_2$ and $F_3$.

By comparing a difference between the calculated total equivalent $\hat{f}_{total}$ and the known monthly charges $H_j$, an error can be estimated for each considered schedule $S_i$. In the described example, this error is summed over all available billing periods as part of the iteration 320 in a step 324. For example, the error may be computed using the following formula:

$$\text{Error}_i(\sigma, \mu, \rho) = \sum_j (F_{total} - H_j)^2$$

In a last phase, the energy profile most likely used by the user is identified by selecting the energy profile that best matches the available training data. In the described example, this is done in the outermost iteration 310 by selecting the schedule with the smallest calculated error in a step 314. For example, the best fitting parameters may be determined based on the following formula:

$$\sigma^*, \mu^*, \rho^*, i^* = \arg\min_{i,\sigma,\mu,\rho} \text{Error}_i(\sigma, \mu, \rho)$$

Below, a specific example of how to match a given monthly charge and consumption value to a given schedule is provided. As detailed above, in the described approach, the daily consumption pattern is assumed to follow a Gaussian distribution. Thus, before conducting the estimation, some parameters need to be defined to provide a basis for a grid search. In each loop of the grid search, a consumption pattern will be generated based on the Gaussian distribution with mean value $\mu$ in variant $\sigma$. This consumption pattern is then scaled with the monthly consumption and hence the consumption charge and demand charge can be calculated for a given schedule $S_i$.

For the example discussed in the following, a schedule of the Jersey Central Power and Lt. Co. of New Jersey is considered, which is available from the so-called OpenEI website at the URL http://en.openei.org/apps/USURDB/rate/view/539fGa62ec4f024411ec8e89. For easier reference, the rate information of this schedule is also reproduced in FIGS. 4A to 4D attached this specification. Moreover, in order to model the consumption profile of the user site 140, the following optimization parameters are used: $\mu=12$, $\sigma=2$ and $\rho=0.5$.

Based on the Gaussian distribution described by by mean value $\mu=12$, i.e. midday, and variance $\sigma=2$, the following vector $\hat{c}$ of 24 different consumption values for 24 corresponding hourly timeslots of a day is generated:

$\hat{c}=[5.7695\times10^{-8}, 7.9646\times10^{-7}, 8.5628\times10^{-6},$
$7.1695\times10^{-5}, 4.6751\times10^{-4}, 2.3742\times10^{-3},$
$9.3902\times10^{-3}, 2.8924\times10^{-2}, 6.9385\times10^{-2},$
$1.2963\times10^{-1}, 1.8861\times10^{-1}, 2.1372\times10^{-1},$
$1.8861\times10^{-1}, 1.2963\times10^{-1}, 6.9385\times10^{-2},$
$2.8924\times10^{-2}, 9.3902\times10^{-3}, 2.3742\times10^{-3},$
$4.6751\times10^{-4}, 7.1695\times10^{-5}, 8.5628\times10^{-6},$
$7.9646\times10^{-7}, 5.7695\times10^{-8}, 3.2550\times10^{-9}]$ This vector $\hat{c}$ indicates the hypothetical consumption pattern of one day characterized by the underlying parameter set. Before computing the estimated charge, the vector $\hat{c}$ needs to be weighed by the total usage and divided by the number of days. Suppose that from electronic billing data available for the user site 140, it is known that the usage for a given month, for example June, is 24,160 kWh. As June has 30 calendar days, the weighing factor of the consumption pattern is 24,160/30=805.33 kWh per day and the weighted consumption pattern c becomes:

c=[0, 0.0006, 0.0069, 0.0577, 0.3765, 1.9120, 7.5622, 23.2932, 55.8776, 104.3931, 151.8910, 172.1151, 151.8910, 104.3931, 55.8776, 23.2932, 7.5622, 1.9120, 0.3765, 0.0577, 0.0069, 0.0006, 0, 0]

According to the available schedule, we know that the total equivalent $H_j$ comprises three contributions, a consumption-based contribution, a demand-based contribution and a fixed contribution. According to the schedule, we know that the consumption-based contribution $F1=f_{consumption}(c, S)$ can be calculated by:

$$f_{consumption}(c, S_i) = n_{wd} \times \left( \sum_{t=0}^{7} g_1(c_t) + \sum_{t=8}^{19} g_3(c_t) + \sum_{t=20}^{23} g_1(c_t) \right) + n_{we} \times \sum_{t=0}^{23} g_1(c_t)$$

Therein, the functions $g_b(c_t)$ represents the energy rates for a given energy profile band b of a daily schedule for the corresponding time slots $c_t$ of the consumption profile c. Moreover, the parameters $n_{wd}$ and $n_{we}$ represent the number of weekdays and the number of weekends in the considered period, respectively. Typically, the functions $g_b$ are defined based on the schedule $S_i$ in the form of piece-wise linear functions.

For the energy profile shown in FIG. 4C, two relevant energy profile bands for the month of June are defined as follows:

$$g_1(c_1)=c_1 \times (0.0219+0.1088) \text{ and } g_3(c_3)=0$$

According to the weighted consumption pattern c and the energy usage rates shown in FIG. 4C, one can see that the consumption-based first contribution F1 for the month of June based on the assumption that the consumption pattern follows $\mathcal{N}(12,2)$ can be calculated as:

$$F1=1.2969 \text{ US\$} \times 22+112.7600 \text{ US\$} \times 8=929.9518 \text{ US\$}$$

For estimating the demand-based component of the energy costs, the highest electricity consumption in any one timeslot is considered. However, for the actual demand charge only on the highest demand, i.e. the overall peak consumption, is taken into account. Based on the schedule S according to FIG. 4B, one can see that this contribution $F_2$ can be calculated by the following equation:

$$F2 = f_{demand}(c, \rho, S) = h_1\left(\max_i c_i \times (1+\rho)\right)$$

Figure 4B:
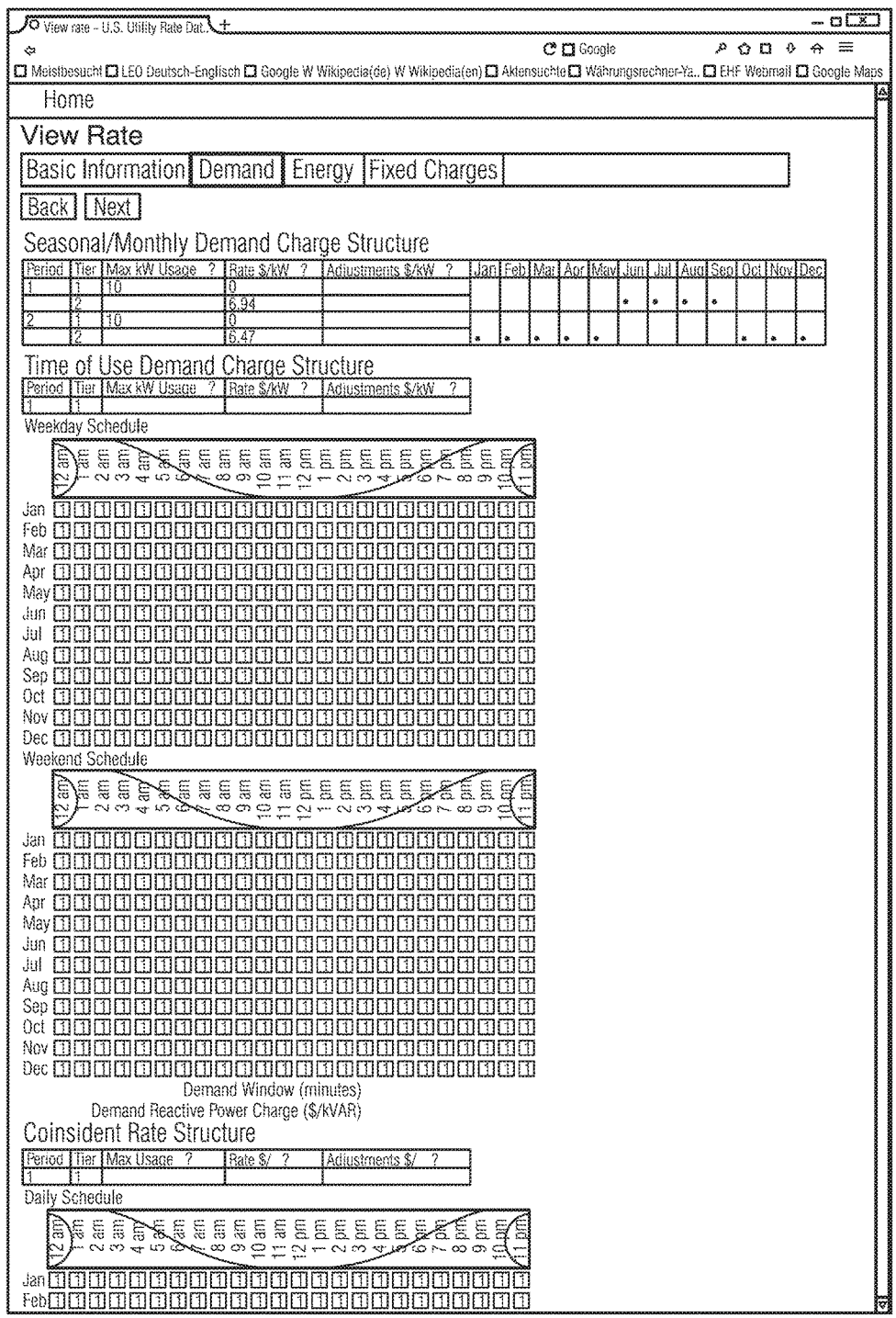

Therein, $\max_i c_i \times (1+\rho)$ represents the predicted peak consumption modelled based on peak demand modification parameter $\rho$. This optimization factor takes into account the simplification used during calculation of the consumption pattern c, assuming that each day has the same average consumption. In practise, on weekdays the average energy consumption is typically higher than on weekends, leading to an underestimation of the predicted peak power. This can be corrected by the peak demand modification parameter $\rho$. Moreover, the function $$h_1(x) = \begin{cases} 0 \text{ US\$} & \text{if } x \leq 10 \text{ kW} \\ (x-10) \times 6.94 \text{ US\$/kW} & \text{if } x > 10 \text{ kW} \end{cases}$$

is based on the rate information shown in FIG. 4B.

As explained in more detail with respect to the first component, by combining the above equations with the consumption pattern c, we can calculate the demand-based equivalent F2=1,722.3180 US$.

Figure 4D:
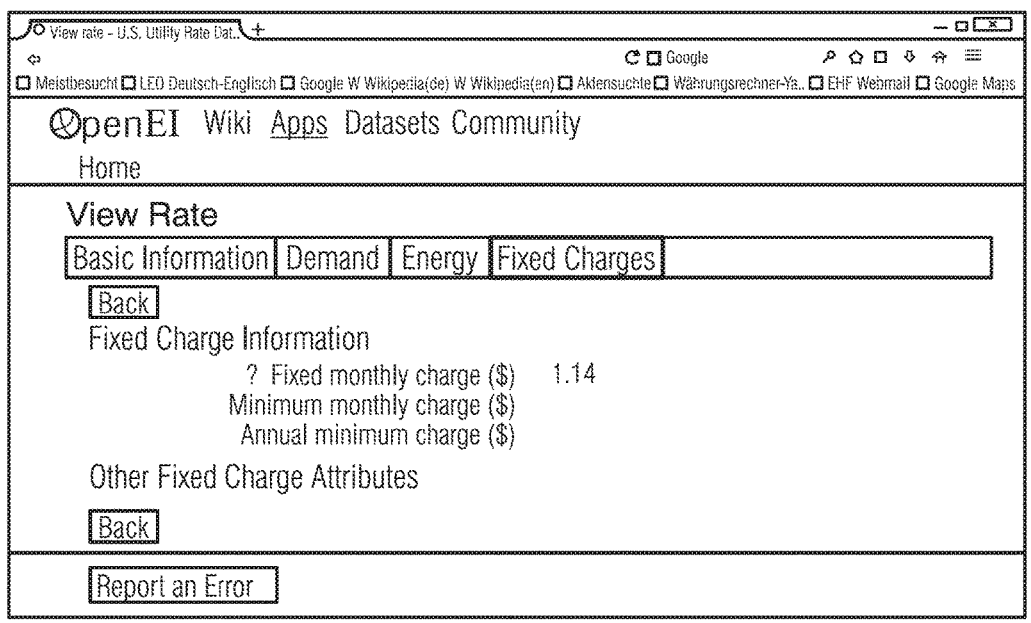

Lastly, based on the fixed fees shown in FIG. 4D, a third component of the monthly energy equivalent can be calculated. Accordingly, the total estimated energy profile equivalent for the considered month of June with parameters $\mu=12$, sigma=2 and $\rho=0.5$ as well as the schedule shown in FIGS. 4A to 4D is $$\hat{f}_{total}=929.9518\text{US\$}+1,722.3180\text{US\$}+1.1400\text{US\$}=2,653.4098\text{US\$}$$

The above-described procedure for calculating the total estimated energy profile equivalent is repeated for a number of months for which corresponding information is available. For example, the procedure may be repeated for half a year corresponding to six monthly billing periods. Then, the errors between the estimated equivalent and the actual costs are squared and accumulated in order to determine which of the plurality of rate schedules best fits the available data. Once all the available predefined parameter sets, rate schedules and monthly information have been processed, the optimal parameter set will be selected based on the smallest calculated error. The corresponding schedule can then be used by the system 100 to conduct a energy profile estimation for current and future bills.

The estimation of current and future energy costs essentially works in the same way as described above with respect to the computation of the various contribution to an energy bill. However, in this case, the optimization parameters $\mu^*$, $\sigma^*$, $\rho^*$ and $i^*$ are already known from the energy profile identification. Thus, based on a given current consumption value K, the usage equivalent calculation module 110 may determine the equivalent of a current energy consumption. Moreover, by employing the consumption profile estimation module 104 and a peak load estimation module 106, the prediction module 118 may also infer an expected amount for a currently running period, for example by linear extrapolation.

In one embodiment of the present invention, at the end of a period, the total amount of money charged will be cross-checked with the predicted amount of money calculated by the usage equivalent calculation module 110. Preferably, the accuracy should be no less than 95%. If this desired accuracy is not achieved, the system will repeat the energy profile identification method as detailed above based on the new available monthly information and recalibrate the energy profile equivalent data stored in the database.

The described system and methods allow a fast computation prediction and assessment of current and future energy equivalent based on very limited information typically available over open interfaces such as electronic bills provided by utility providers and energy profile schedule information available over comparison websites such as the crowdsources energy information database OpenEI.

The described system has a number of commercial benefits, including that a user of a site can see ahead of time how much the electricity the user is currently using will be charged for. In this way, the available information motivates users to save more energy and to easily identify savings available by implementing energy saving strategies or solutions.

What is claimed is:

1. A cloud based method for identifying an energy profile of an end user, the method comprising:
    obtaining, over a data network, information including a total amount of energy consumed at a location of the end user and a total equivalent for at least one previous period from at least one listing of the end user;
    estimating, at one or more processors, a consumption profile for a plurality of timeslots based on the total amount of consumed energy;
    estimating, at the one or more processors, a peak load for a given period based on the estimated consumption profile;
    obtaining a plurality of schedules provided over the data network, wherein the schedule comprises at least one demand fee schedule, including rates for a peak demand within a given period and different bands of rates for an energy demand within the given period, each schedule corresponding to an energy profile provided by a utility provider;
    calculating at the one or more processors, for each energy profile, an estimated equivalent by calculating at least a first contribution based on the estimated consumption profile and the schedule corresponding to the respective energy profile and calculating a second contribution based on the estimated peak load and the demand fee schedule corresponding to the respective energy profile by calculating a peak demand fee for the peak demand based on the estimated peak load and the rates comprised in the schedule and by selecting a rate corresponding to a band in accordance with the estimated peak energy consumption based on the following formula $$f_{demand}(c, \rho, S) = h_1\left(\max_i(c_i) \times (1 + \rho)\right)$$

wherein h1(x) corresponds to rates for a peak demand of a given schedule S, $c_i$ is the predicted consumption for a timeslot i, and ρ corresponds to a peak demand modification parameter;
    calculating at the one or more processors, for each energy profile, an error between the obtained total equivalent for the period and each one of the respective calculated estimated equivalents comprising at least the first contribution;
    selecting, at the one or more processors, an energy profile from a plurality of energy profiles corresponding to the smallest calculated error as the energy profile most likely used by the end user;
    obtaining, at the one or more processors, current energy consumption data for the end user; and
    calculating, at the one or more processors, a current energy equivalent based on the schedule corresponding to the selected energy profile and the obtained current energy consumption data of the end user.

2. The method according to claim 1, wherein at least one schedule of the plurality of schedules comprises a fixed fee for each period, and wherein, in the step of calculating an estimated equivalent, a third contribution is calculated based on the fixed fee of the at least one schedule.

3. The method according to claim 1, wherein the period consists of a number of calendar days, and, in the step of estimation the consumption profile, the obtained total amount of consumed energy is divided by the number of calendar days of the period to obtain an average daily energy consumption, and an energy consumption for each timeslot of the consumption profile is based on a normal Gaussian distribution of the average daily energy consumption over the plurality of timeslots.

4. The method according to claim 1, wherein in the step of obtaining information, a total amount of consumed energy and a total equivalent is obtained for a plurality of different billing periods, wherein the steps of estimating the consumption profile, calculating the estimated equivalent and calculating the error are performed for each period and, in the step of selecting the energy profile from the plurality of energy profiles, the energy profile corresponding to the smallest calculated error over all provided billing periods is selected.

5. The method according to claim 1, wherein at least one of the consumption profile and a peak load is estimated based on at least one optimization parameter comprised in a selected parameter set of a plurality of parameter sets, the steps of estimating the consumption profile, calculating the estimated equivalent and calculating the error are performed for each one of the plurality of parameter sets, and, in the step of selecting the energy profile from the plurality of energy profiles, the energy profile corresponding to the smallest error calculated over all parameter sets is selected.

6. The method according to claim 1, wherein at least one schedule of the plurality of schedules comprises energy prices for energy consumed within a given timeslot of the plurality of timeslots, and the first contribution is calculated by summing up the equivalent of consumed energy for each timeslot based on the estimated consumption profile and the energy prices comprised in the at least one schedule.

7. The method according to claim 6, wherein the at least one schedule comprises different energy prices for different days of a week, and the first contribution is calculated by summing up the cost of consumed energy for each day of the week.

8. The method according to claim 6, wherein the at least one schedule comprises different energy prices for different energy profile bands for each day, and the first contribution is calculated by summing up the equivalent of consumed energy for each energy profile band of each day.

9. A cloud based method for estimating energy consumption of an end user, the method comprising:
    obtaining, over a data network, information including a total amount of consumed energy and a total equivalent for at least one previous period from at least one listing of the end user, wherein the cloud based method for estimating the energy consumption of the end user is performed by a cloud-based energy profile identification system;
    estimating, at one or more processors, a consumption profile for a plurality of timeslots based on the total amount of consumed energy;
    estimating, at the one or more processors, a peak load for a given period based on the estimated consumption profile;
    obtaining a plurality of rate schedules provided over the data network, each schedule corresponding to an energy profile provided by a utility provider;
    calculating at the one or more processors, for each energy profile, an estimated equivalent by calculating a first contribution based on the estimated consumption profile and the schedule corresponding to the energy profile and a second contribution based on the estimated peak load and the schedule corresponding to the energy profile;

calculating at the one or more processors, for each energy profile, an error between the obtained total equivalent for the period and the calculated estimated equivalent comprising the first contribution and the second contribution;

identifying an energy profile at the one or more processors, the identified energy profile corresponding to the schedule of the plurality of rate schedules with the smallest calculated error; and calculating, at the one or more processors, a current energy equivalent for a currently running period based on the schedule corresponding to the identified energy profile and a current energy consumption of the end user provided by a metering device installed at a site of the user through a gateway and the Internet to a web service interface of the cloud-based energy profile identification system.

10. The method according to claim 9, wherein at the end of a current period, based on the identified energy profile, an estimated total energy equivalent for the current period is calculated and compared with an actual total energy equivalent provided by an utility provider.

11. The method according to claim 10, wherein the step of identifying an energy profile is repeated based on at least the information of the current period in case the calculated total energy equivalent for the current period differs from the actual total energy equivalent by more than a predefined margin of error.

12. The method according to claim 9, wherein based on the current energy consumption, a total energy equivalent at the end of the current period is predicted based on linear extrapolation.

13. A cloud based energy profile identification system comprising a processor including a non-transitory computer-readable medium storing program modules executable by the computer, the modules including:

a data module configured to obtain information including a total amount of consumed energy and a total equivalent for a period from at least one listing of an end user;

a consumption profile estimation module configured to estimate a consumption profile for a plurality of timeslots based on the total amount of consumed energy;

a peak load estimation module configured to estimate a peak load for a given period based on the estimated consumption profile;

an energy profile data module configured to obtain a plurality of rate schedules provided over a data network, each schedule corresponding to an energy profile provided by a utility provider;

a usage equivalent calculation module configured to calculate, for each energy profile, an estimated equivalent by calculating a first contribution based on the estimated consumption profile and the schedule corresponding to the energy profile and a second contribution based on the estimated peak load and the schedule corresponding to the energy profile;

an error calculation module configured to calculate, for each energy profile, an error between the obtained total equivalent for the period and the calculated estimated equivalent comprising the first contribution and the second contribution;

an energy profile output module configured to output parameters corresponding to a schedule of an energy profile from a plurality of energy profiles corresponding to the smallest calculated error; and a current consumption data module configured to obtain current energy consumption data for the end user, wherein the usage equivalent calculation module is further configured to calculate a current energy equivalent based on the schedule corresponding to the identified energy profile and obtained current energy consumption data of the end user.

14. The cloud based energy profile identification system according to claim 13, wherein the modules further comprise a prediction module configured to predict energy consumption data for a rest of a current period based on a linear extrapolation of obtained current energy consumption data, wherein the usage equivalent calculation module is further configured to calculate a total energy equivalent for the current period based on the predicted energy consumption data.

* * * * *